(12) United States Patent
Hsu et al.

(10) Patent No.: US 7,967,612 B2
(45) Date of Patent: Jun. 28, 2011

(54) SOCKET CONNECTOR HAVING REINFORCED AND COMPACT MOUNTING ARRANGEMENT

(75) Inventors: Shuo-Hsiu Hsu, Tu-Cheng (TW); Nan-Hung Lin, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 17 days.

(21) Appl. No.: 12/549,400

(22) Filed: Aug. 28, 2009

(65) Prior Publication Data

US 2010/0055938 A1     Mar. 4, 2010

(30) Foreign Application Priority Data

Sep. 1, 2008   (TW) ............................... 97215670 A (51) Int. Cl.
*H01R 12/00*   (2006.01)

(52) U.S. Cl. .......................................... 439/73; 439/331

(58) Field of Classification Search .................... 439/73, 439/331
See application file for complete search history.

(56) References Cited

U.S. PATENT DOCUMENTS 6,974,345 B2 * 12/2005 Yang et al. .................... 439/331
7,210,952 B2 *  5/2007 Ishida ........................... 439/331

* cited by examiner

*Primary Examiner* — Ross N Gushi
(74) *Attorney, Agent, or Firm* — Andrew C. Cheng; Wei Te Chung; Ming Chieh Chang (57) ABSTRACT

An electrical connector assembly for establishing electrical connection between an Integrated Package (IC) and a Printed Circuit Board (PCB) is provided. The electrical connector assembly comprises an insulative housing, a plurality of contacts received in the insulative housing, a PCB adapted to have the insulative housing mounted thereon and a metal reinforcement element disposed on a lower surface of the housing and soldered to the PCB. By way abovementioned, a back plate may be canceled and space under the PCB is saved under a condition that steady mechanical connection between the PCB and the housing is achieved.

18 Claims, 14 Drawing Sheets

SOCKET CONNECTOR HAVING REINFORCED AND COMPACT MOUNTING ARRANGEMENT

BACKGROUND OF THE INVENTION

1. Field of the Invention

The present invention relates to an electrical connector for electrically connecting an Integrated Package (IC) such as a microprocessor with a circuit substrate such as a printed circuit board (PCB), and more particularly to a socket connector having metallic reinforced mounting arrangement for readily and compactly mounting the socket connector onto the printed circuit board.

2. Description of Prior Art

Land Grid Array (LGA) connector is widely used for establishing electrical connection between an electronic package, e.g. a Central Processing Unit (CPU), and a PCB, e.g. a motherboard. Contact of the LGA connector generally comprises a resilient arm for engaging with pad arranged on the CPU. Such LGA connector is typically illustrated in U.S. Pat. No. 7,044,746 issued to Copper on May 16, 2006. When a LGA connector is mounted onto an upper surface of the PCB, a back plate will be assembled with the LGA connector from a lower surface of the PCB so as to reinforce strengthen of the LGA connector. Thus, steady mechanical connection between the LGA connector and the PCB is established.

U.S. Pat. No. 7,470,128 issued to Ju on Dec. 30, 2008 disclose a LGA connector. The connector comprises an insulating body 11, conducting pins 12, a rod 13, and a fastening device. The fastening device includes a back plate 14, and a fastening hook 15 that is located on the back plate 14. The fastening portion of the rod 13 is wedged to the fastening hook of the fastening device. Thereby, the chip module is firmly fastening in the insulating body.

However, as we know, the LGA connector and the PCB are secured within an enclosure of the computer. Because of the back plate occupies a space that is under the lower surface of the PCB, other electronic components will not be conveniently mounted under the lower surface of the PCB in the interior of the shell. One solution is to increase the size of the shell. Obviously, such means can not meet the need of trend for miniaturization of the electronic devices.

In view of the above, an improved electrical connector that overcomes the above-mentioned disadvantages is desired.

SUMMARY OF THE INVENTION

Accordingly, an object of the present invention is to provide an electrical connector/assembly for electrically connecting an electronic package such as a CPU with a circuit substrate such as a PCB, which has metallic reinforced mounting arrangement for readily and compactly mounting the socket connector onto the printed circuit board.

To achieve the above-mentioned object, an electrical connector assembly for establishing electrical connection between an Integrated Package (IC) and a Printed Circuit Board (PCB) is provided. The electrical connector assembly comprises an insulative housing, a plurality of contacts received in the insulative housing, a PCB adapted to have the insulative housing mounted thereon and a metal reinforcement element disposed on a lower surface of the housing and soldered to the PCB. By above-mentioned way, a back plate may be canceled and space under the PCB is saved under a condition that steady mechanical connection between the PCB and the housing is achieved.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Referring to FIGS. 1-6, an electrical connector 1 in accordance with a first preferred embodiment of the present invention used for electrically connecting an Integrated Package (IC) 8 with a Printed Circuit Board (PCB) 9 is shown. The connector 1 comprises an insulative housing 10 having a plurality of passageways 1000, and a plurality of electrical contacts 12 received in corresponding passageways, respectively, a pressing member 14 for securing the IC 8 in the insulative housing 10, and a plurality of fastener 16 for securing the pressing member 14.

Figure 1:
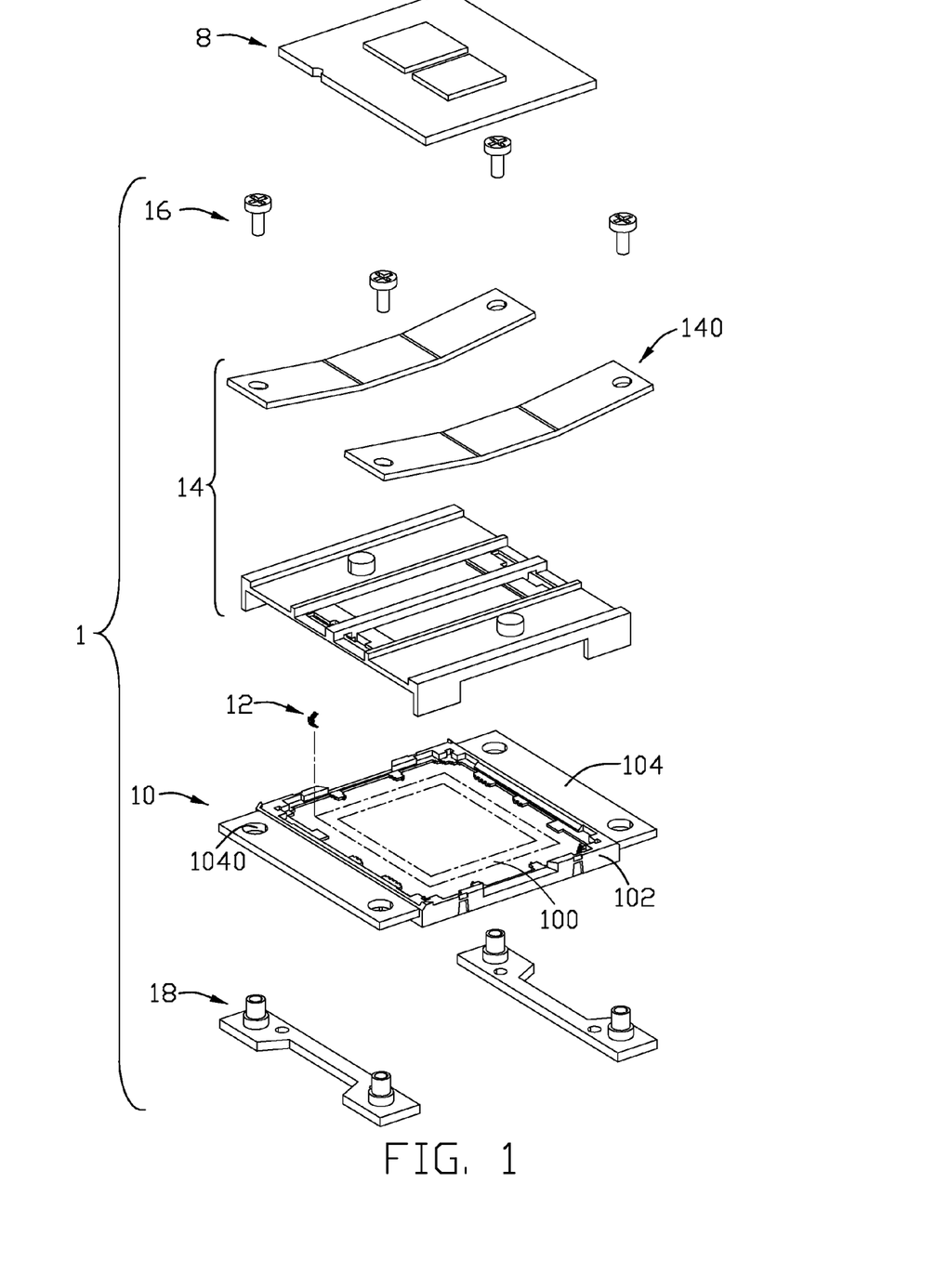
FIG. 1 is an isometric, exploded view of an electrical connector in accordance with a first preferred embodiment.
Figure 2:
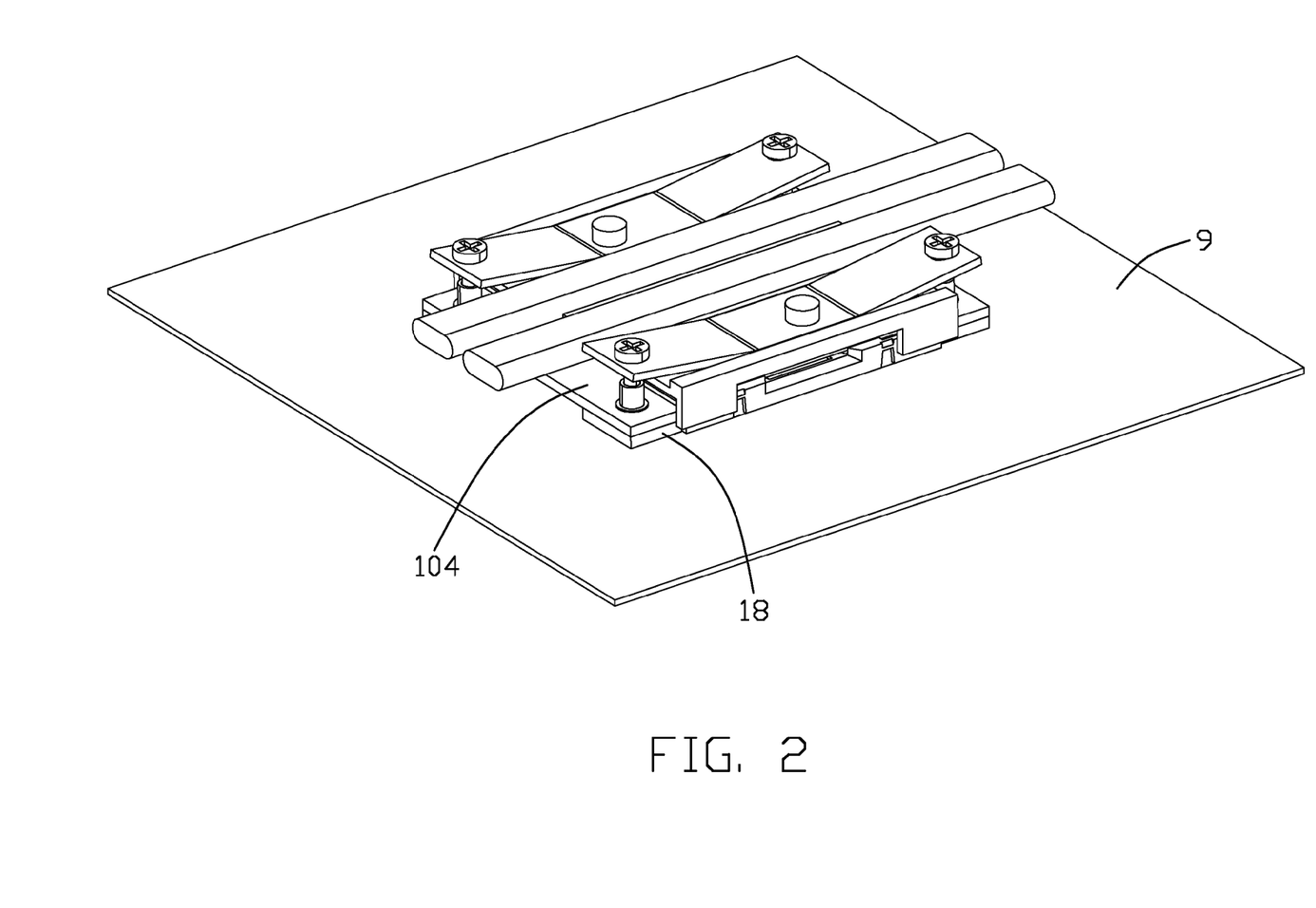
FIG. 2 is an isometric view of an electrical connector mounted on a PCB in accordance with a first preferred embodiment.
Figure 3:
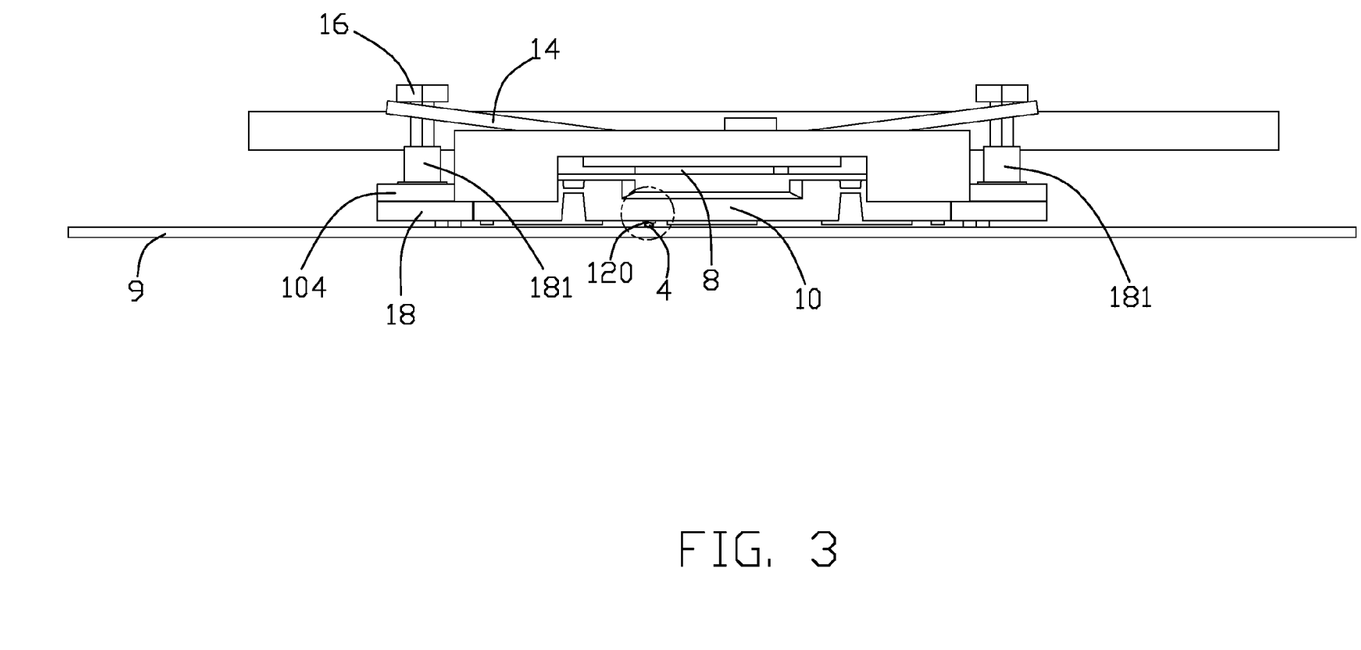
FIG. 3 is a side view of FIG. 2.
Figure 3A:
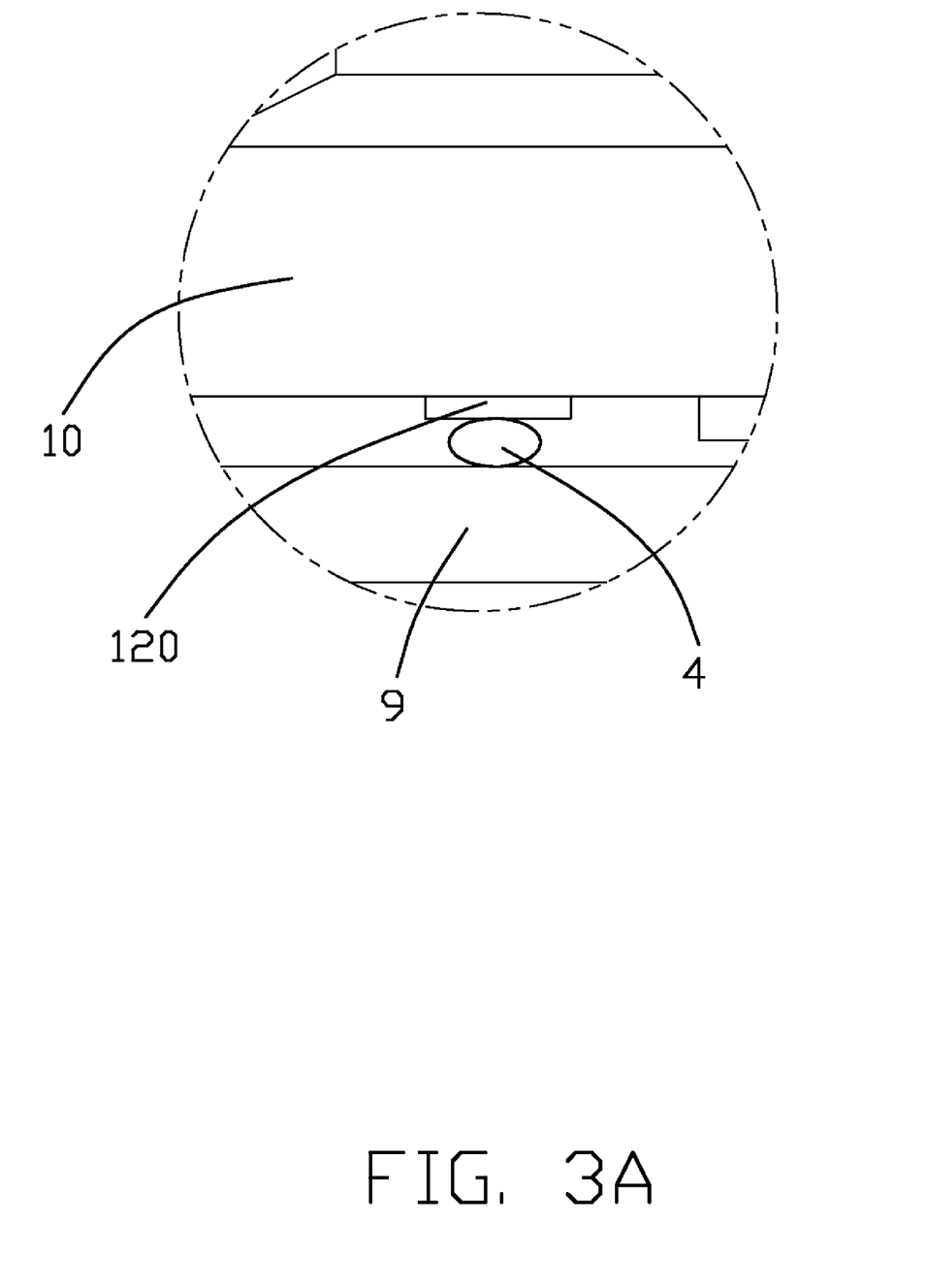
FIG. 3A is an enlarged view of the circle portion of FIG. 2.
Figure 4:
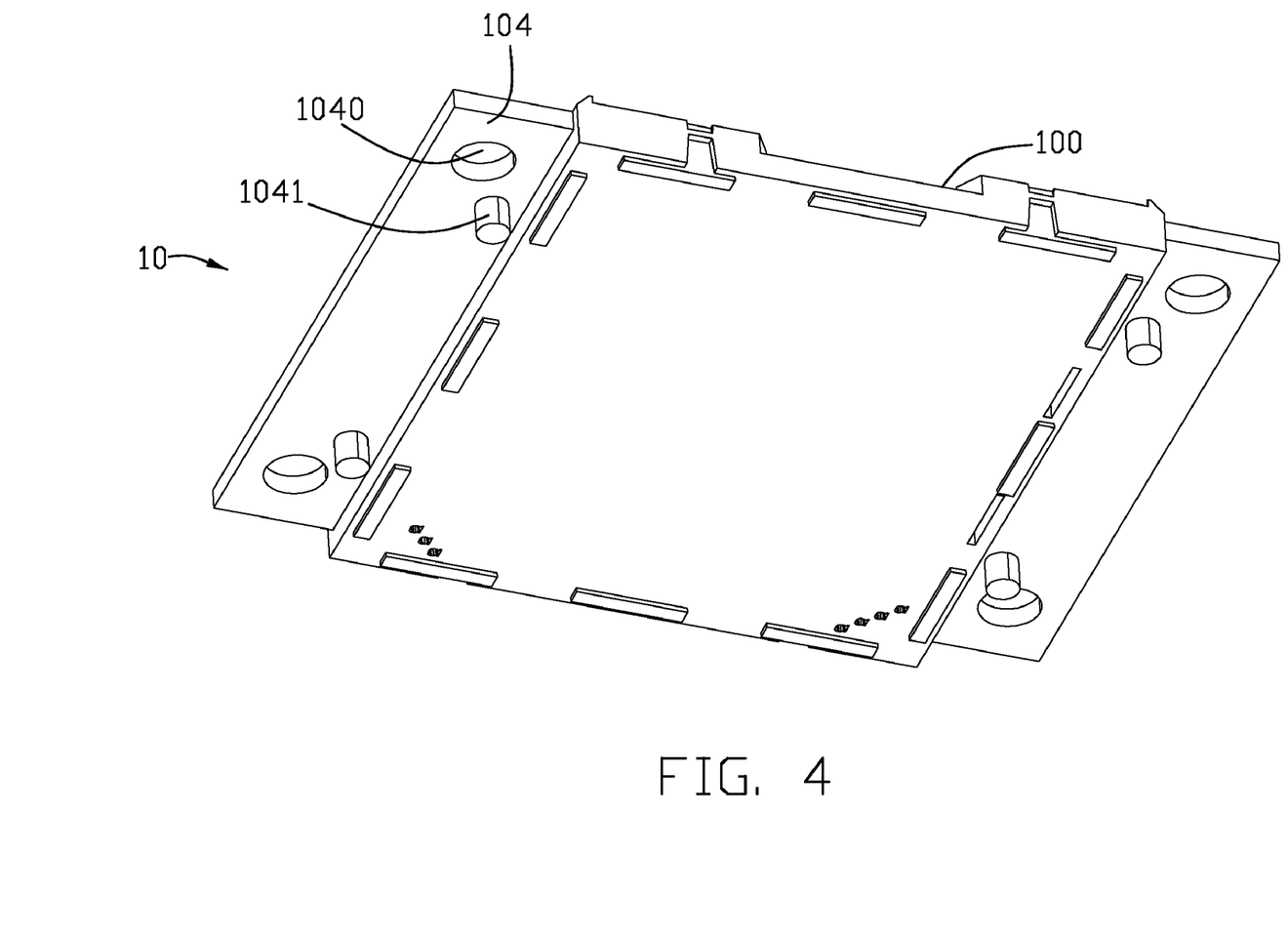
FIG. 4 is a bottom view of the insulative housing of the electrical connector in accordance with the first preferred embodiment.
Figure 5:
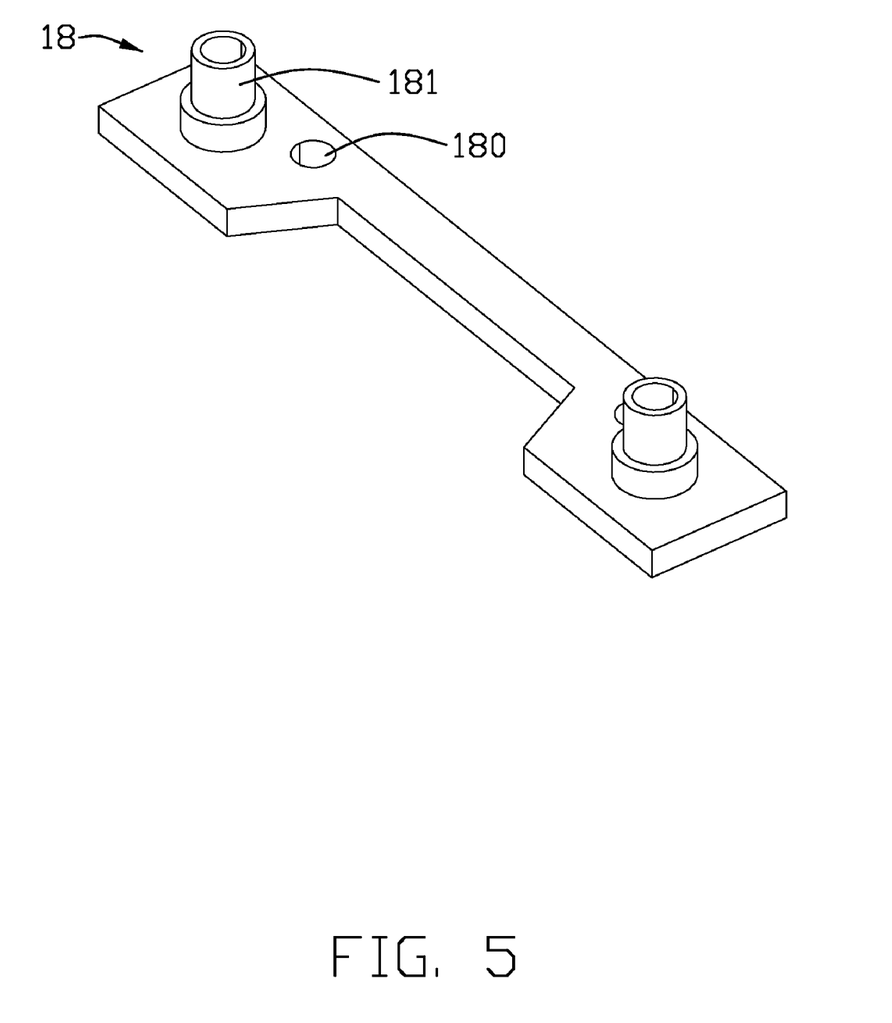
FIG. 5 is an isometric view of the reinforcement element in accordance with the first preferred embodiment.
Figure 6:
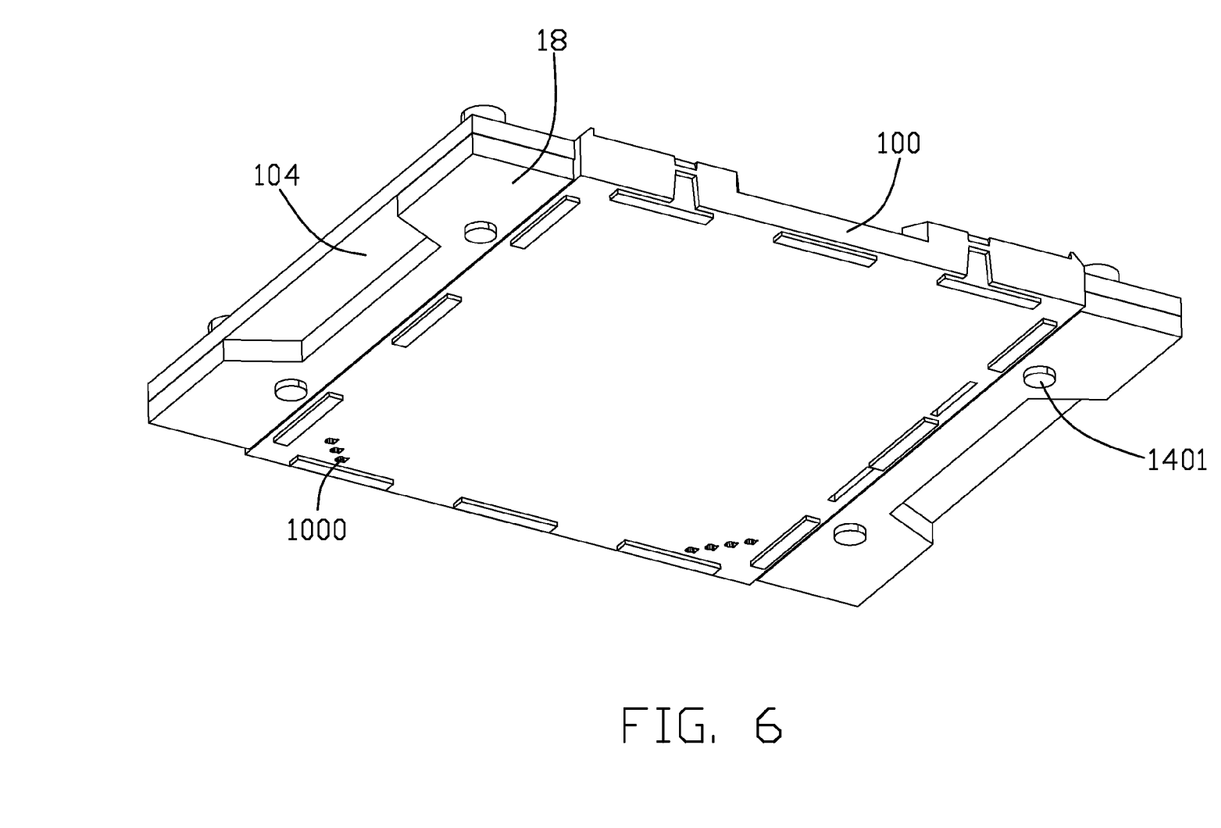
FIG. 6 is an assembled view of the reinforcement element and the housing in accordance with the first preferred embodiment.
Figure 7:
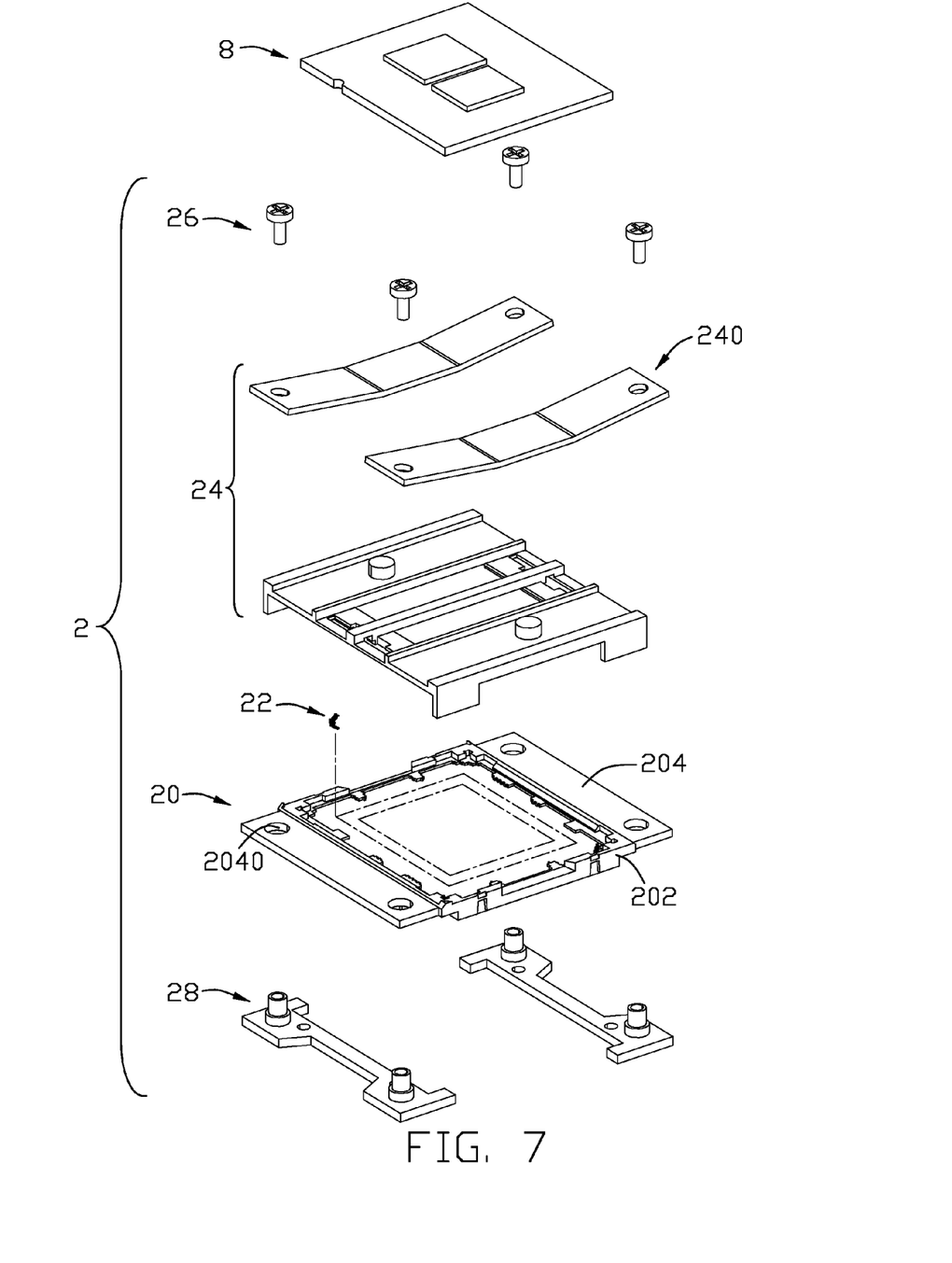
FIG. 7 is an isometric, exploded view of an electrical connector in accordance with a second preferred embodiment.
Figure 8:
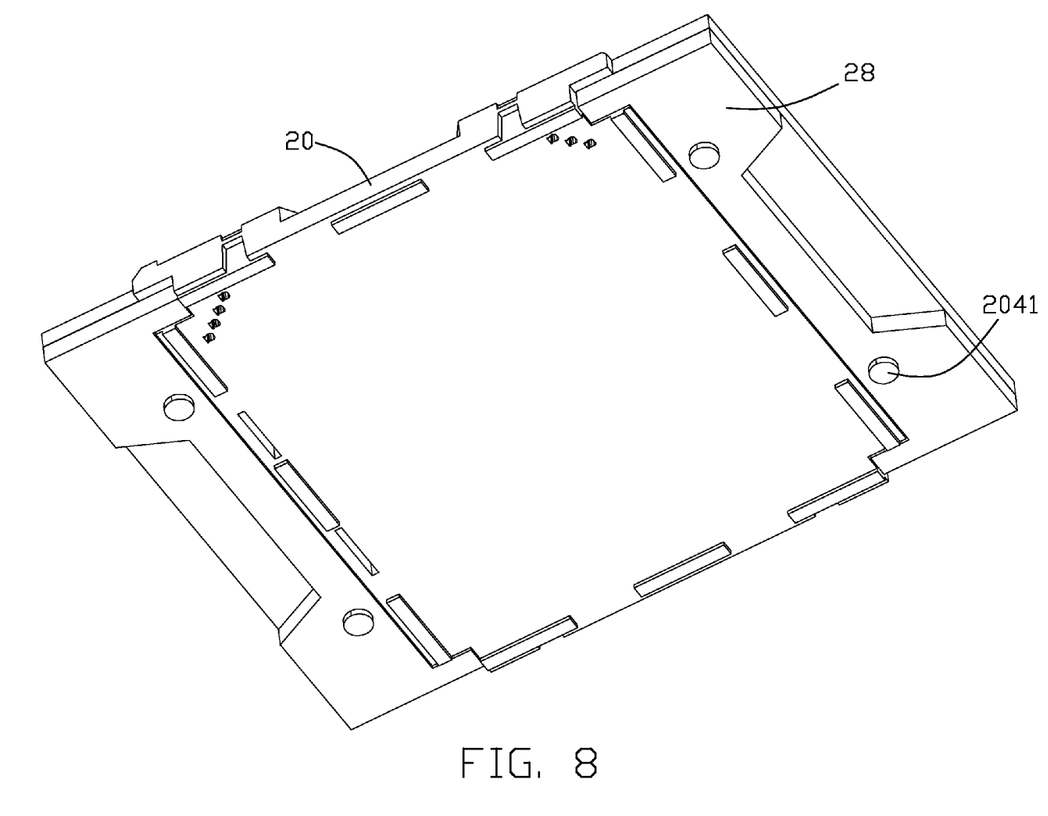
FIG. 8 is an assembled view of the reinforcement element and the housing in accordance with the second preferred embodiment.
Figure 9:
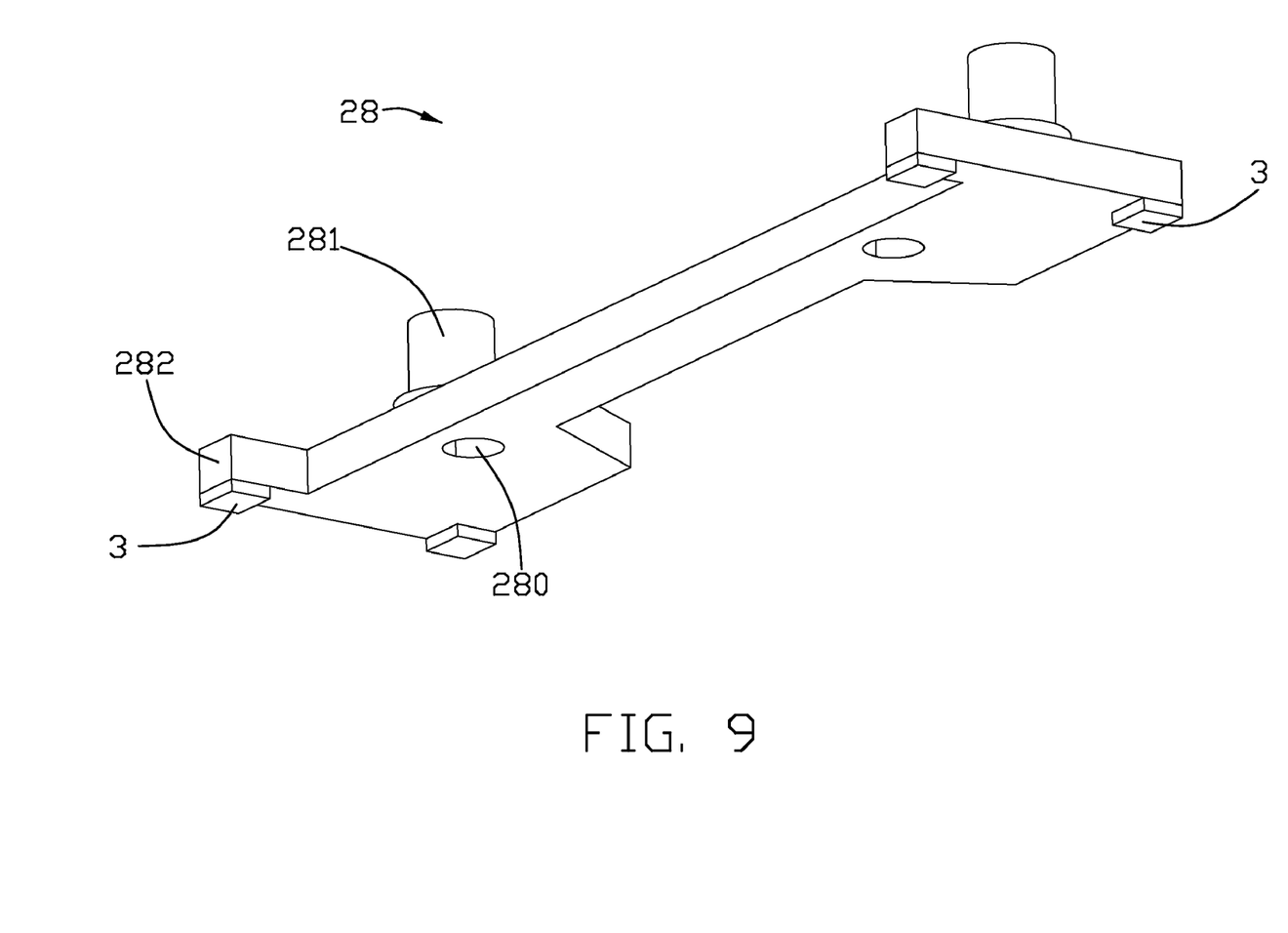
FIG. 9 is an isometric view of the reinforcement element in accordance with the second preferred embodiment.
Figure 10:
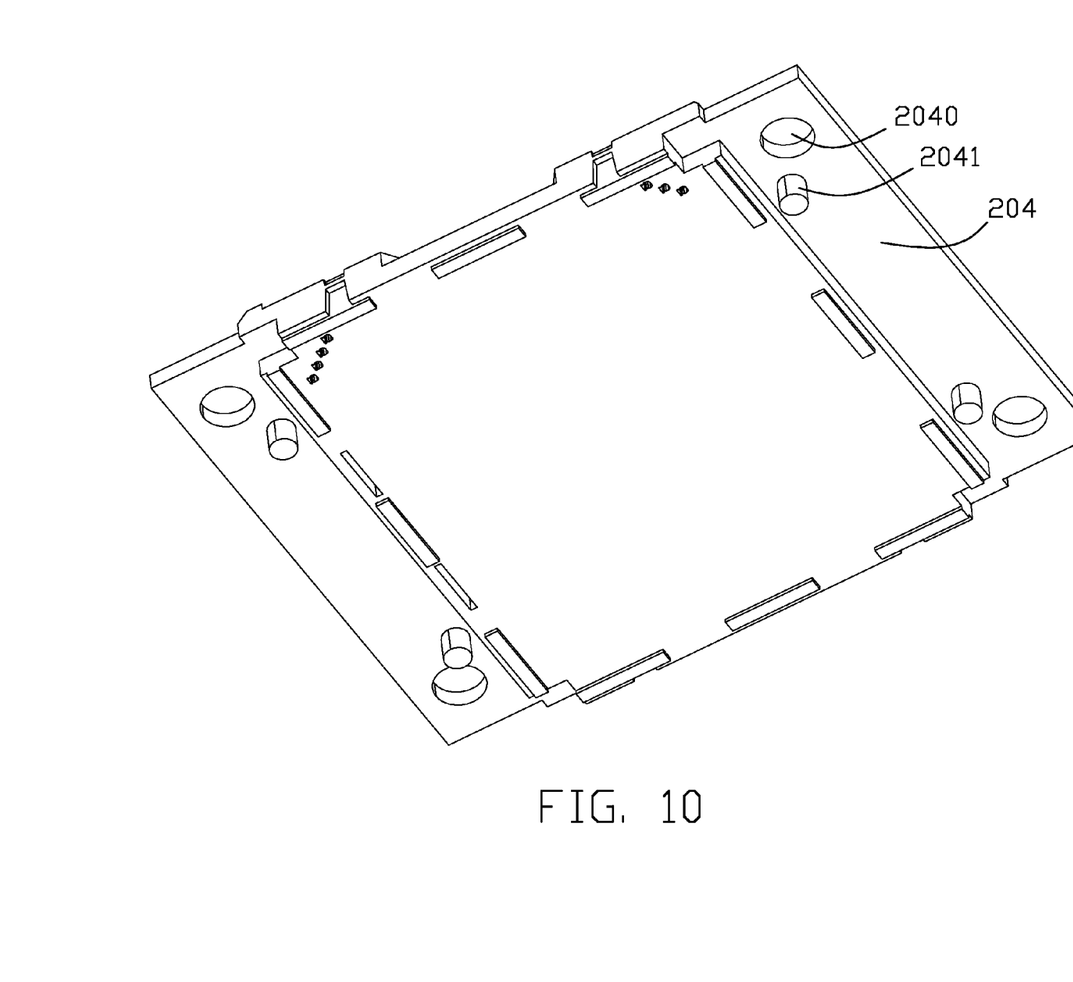
FIG. 10 is an isometric view of the insulative housing of the electrical connector in accordance with the second preferred embodiment.

The insulative housing 10 comprises a base 100, peripheral walls 102 extending upwardly from edges of the base 100 and defining a receiving cavity therebetween adapted to have the IC 8 received therein. As shown in FIG. 3A, the plurality of contacts 12 are received in the base 100 and the soldering end 120 is soldered to the PCB 9 via soldering ball 4. Two opposite peripheral walls 102 each define an extending portion 104 extending in a direction of away from the receiving cavity. The extending portion 104 defines a plurality of through holes 1040. In this embodiment, extending portion 104 defines two through holes 1040 at opposite ends thereof, respectively.

Furthermore, the extending portion 104 defines a plurality of projections 1041 extending downwardly.

In this embodiment, a bottom surface of the extending portion 104 and a bottom surface of the insulative housing 10 are flushed with each other/or coplanar. Each of extending portions 104 has a reinforcement element 18 attached on the bottom surface. The reinforcement element 18 is generally of a plate configuration and made from metallic material or other hard material. The reinforcement element 18 defines an opening (not labeled) in a middle portion, so as to save material and reduce cost. The reinforcement element 18 defines two holes 180 at opposite ends, respectively and two hollow post portions 181 at opposite ends, respectively.

The pressing member 14 defines a plurality of positioning holes 140 corresponding to the through holes 1040. In an assembly, the IC 8 is loaded into the receiving cavity of the housing 10 and the pressing member 14 is disposed upon the IC 8, and the fastener 18 passes through the positioning holes 140 and the through holes 1040 in turn to engage with the post portion 181. The insulative housing 10 is attached to the PCB 9 by the contact 12 soldered to the PCB 9. Thus, the pressing member 14, the IC 8, the insulative housing 10 and the PCB 9 are assembled together. In addition, each of the holes 180 of the reinforcement element 18 engages with a projection 1401 of the housing 10 by interference fit, thus providing a steady and reliable mechanical connection between the reinforcement element 18 and the housing 10.

Because of the reinforcement element 18 disposed at the bottom surface of the housing 10, overall rigidity of the housing 10 is increased. Therefore, there is no need to place a back plate onto a lower surface of the PCB 9. Accordingly, mounting space under the lower surface of the PCB 9 is spared for other electronic components.

Reference is now made to FIGS. 7-10, an electrical connector 2 in accordance with a second preferred embodiment of the present invention using for electrically connecting an IC 8 with a PCB 9 is shown. The electrical connector 2 has a structure which is similar to the electrical connector 1 and comprises an insulative housing 20 having a plurality of passageways (not shown), and a plurality of electrical contacts 22 received in corresponding passageways, respectively, a pressing member 24 for securing the IC 8 in the insulative housing 20, and a plurality of fastener 26 for securing the pressing member 24. A reinforcement element 28 made from metal is disposed at a bottom surface of insulative housing 20.

In an assembly, the IC 8 is inserted into the receiving cavity of the housing 20 and the pressing member 24 is disposed upon the IC 8, and the fastener 28 passes through the positioning holes 240 and the through holes 2040 in turn to engage with the post portion 281. In addition, each of the holes 280 of the reinforcement element 28 engages with a projection 2401 of the housing 20 by interference fit. By this doing, the reinforcement element 28 is attached onto the bottom surface of the insulative housing 20.

Figure 11:
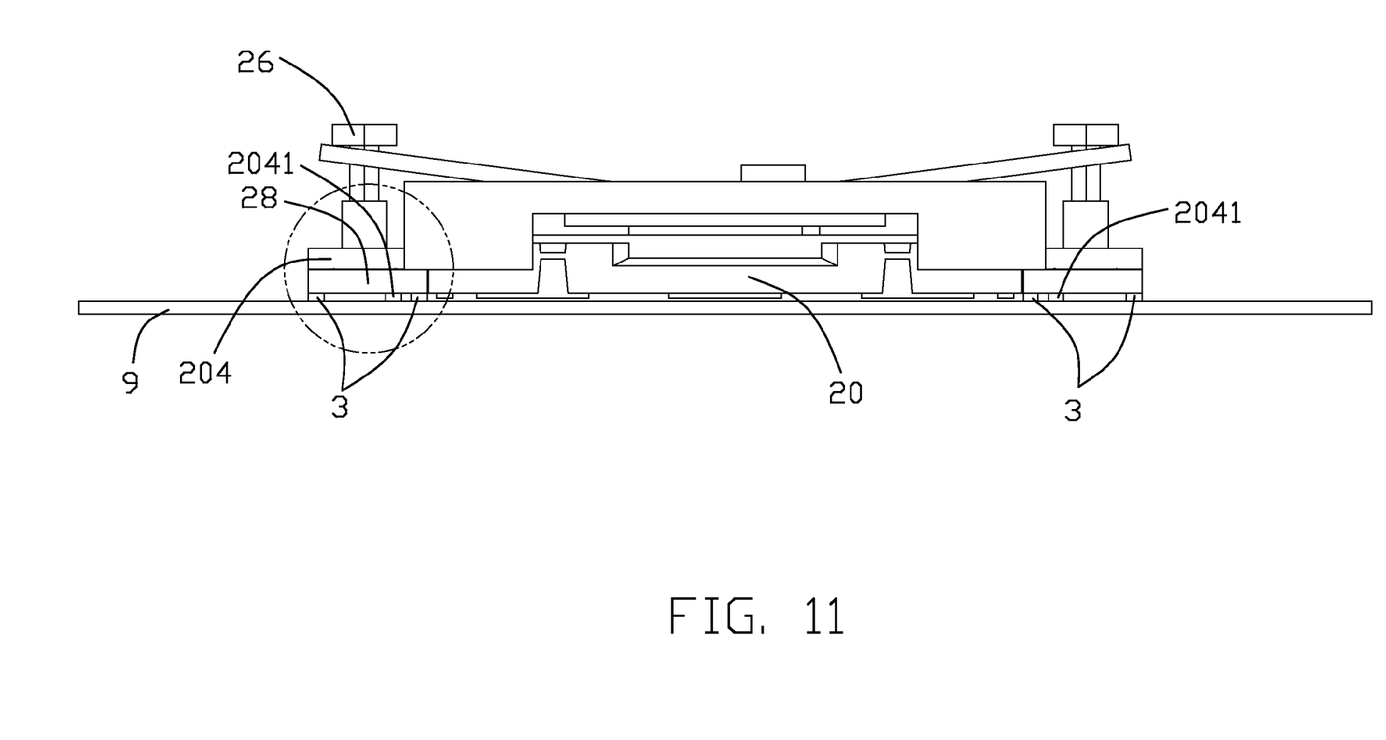
FIG. 11 is an isometric, assembled, side view of an electrical connector mounted on a PCB in accordance with a second preferred embodiment.
Figure 11A:
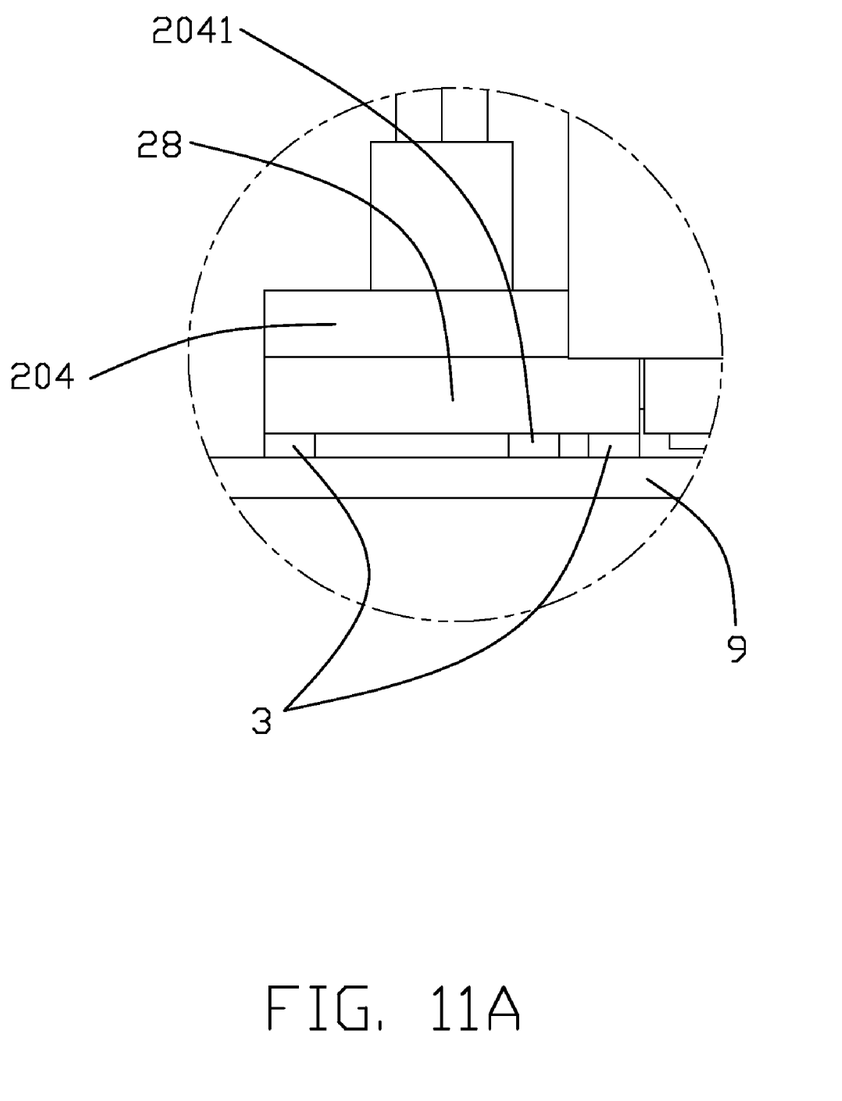
FIG. 11A is an enlarged view of the circle portion of FIG. 11.

As an alternative, the reinforcement element 28 has a soldering portion 282 extending toward a contact region and occupying a certain region in the contact region. As shown in FIG. 11, when the electrical connector 2 is mounted onto the PCB 9, the soldering portion 282 is soldered to the PCB 9 via the solder mass 3. Two opposite sides of the insulative housing 20 each have a reinforcement element 28 attached on the bottom surface. Accordingly, besides the strength of the insulative housing 12 is increased, the mechanical connection between the housing 10 and the PCB 9 is increased.

Figure 12:
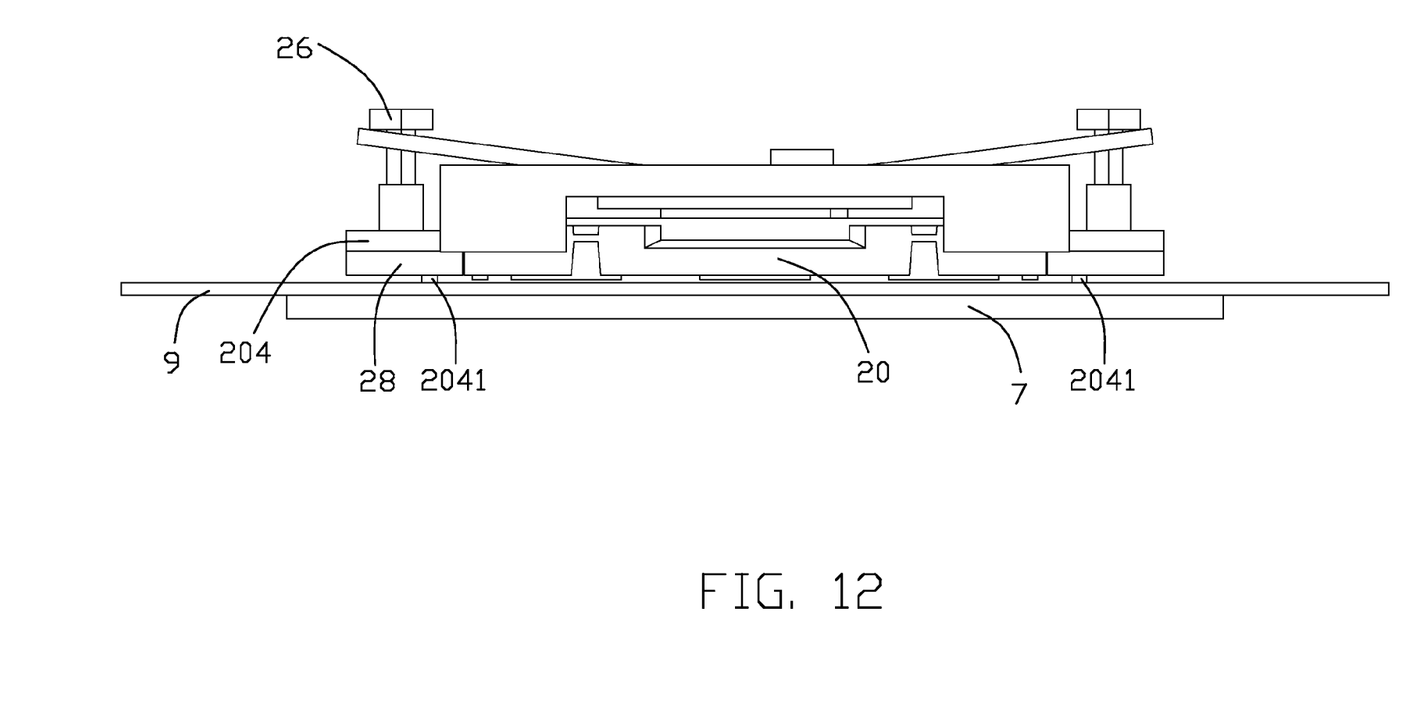
FIG. 12 is an isometric view of an electrical connector mounted on a PCB in accordance with a third preferred embodiment.

As an alternative, as shown in FIG. 12, a third embodiment in accordance with the present invention is achieved when a back plate 7 is disposed at a lower surface of the PCB 9. In the embodiment, thickness of the back plate 7 may be smaller and thinner than a conventional back plate and accordingly mounting space under lower surface of the PCB is provided for mounting other electronic component. Alternatively, if the fastener 26 can pass through the positioning holes 240 and the through hole 2040, so as to engage with the back plate 7.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for establishing electrical connection between an Integrated Package (IC) and a Printed Circuit Board (PCB), comprising:
   an insulative housing having a plurality of through holes;
   a plurality of contacts received in the insulative housing;
   a pressing member for securing an electronic package in the housing and defining a plurality of positioning holes corresponding to said through holes;
   a plurality of reinforcement elements secured on a lower surface of the housing, each reinforcement element defining a plurality of post portions associated with the through holes, respectively; and
   a plurality of fasteners associated with the positioning holes and engageable with the post portion, thus making the pressing member and the reinforcement elements attached to each other from opposite sides of the housing.

2. The electrical connector as claimed in claim 1, wherein the housing defines a pair of extending portions at two opposite sides respectively, said through disposed at the extending portions and said reinforcement elements disposed at a bottom surface of the extending portions.

3. The electrical connector as claimed in claim 1, wherein the housing defines a plurality of peripheral walls, which define a receiving cavity therebetween for receiving the IC, a pair of extending portions extending from two opposite peripheral walls, said through holes being) disposed at the extending portions and said reinforcement elements being disposed at a bottom surface of the extending portions.

4. The electrical connector as claimed in claim 3, wherein each of the extending portions has a reinforcement element thereon.

5. The electrical connector as claimed in claim 3, wherein said reinforcement element is made from metal material and defines a soldering portion extending into a contact region being soldered to the PCB.

6. The electrical connector as claimed in claim 5, wherein opposite ends of the reinforcement element define a soldering portion, respectively.

7. The electrical connector as claimed in claim 5, wherein the reinforcement element defines an opening in a middle portion.

8. The electrical connector as claimed in claim 3, wherein the extending portion defines a plurality of projections and the reinforcement element defines a plurality of holes corresponding to and interference fit with said projections.

9. The electrical connector as claimed in claim 1, wherein the post portion is of a hollow structure.

10. An electrical connector assembly for establishing electrical connection between an Integrated Package (IC) and a Printed Circuit Board (PCB), comprising:
    an insulative housing:
    a plurality of contacts received in the insulative housing;

a PCB adapted to have the insulative housing mounted thereon; and a metal reinforcement element disposed on a lower surface of the housing and soldered to the PCB;

wherein the connector comprises at least two reinforcement elements and disposed at opposite sides of the housing, respectively.

11. The electrical connector assembly as claimed in claim 10, wherein the reinforcement element is attached to a bottom surface of the housing by press fit.

12. The electrical connector assembly as claimed in claim 11, wherein the bottom surface of the housing defines a plurality of projections and the reinforcement element defines a plurality of holes corresponding to the projections.

13. The electrical connector assembly as claimed in claim 11, further comprising a retaining device for securing the IC in the housing.

14. The electrical connector assembly as claimed in claim 13, wherein the retaining device comprises a pressing member having a plurality of positioning holes and a plurality of fasteners.

15. The electrical connector assembly as claimed in claim 14, further comprising a back plate, which is assembled with the electrical connector assembly from a lower surface of the PCB by said fastener.

16. The electrical connector assembly as claimed in claim 10, further including a pressing member for securing an electronic package in the housing, wherein said pressing member, said housing and said reinforcement element are assembled together via a post like structure extending therethrough.

17. A socket connector, comprising:

an insulative housing including a mating interface and a mounting surface with longitudinal ends, recessed regions defined adjacent to the longitudinal ends; and a metallic reinforced plate assembled to the recessed regions and flushed to the mounting surface;

wherein the metallic reinforced plate includes dowel pins extending through the recessed regions of the housing.

18. The socket connector as recited in claim 17, the metallic reinforced plate includes positioning posts extending downward.

\* \* \* \* \*